United States Patent
Lynch

(10) Patent No.: US 7,544,419 B2
(45) Date of Patent: Jun. 9, 2009

(54) COMPONENT SCAVENGED BY EXHAUST GASES, NOTABLY ENGINE SET COMPONENT, AND METHOD FOR COATING SUCH A COMPONENT

(75) Inventor: John Lynch, Rueil Malmaison (FR)

(73) Assignee: Institut Francais du Petrole, Rueil Malmaison Cedex (FR)

( * ) Notice: Subject to any disclaimer, the term of this patent is extended or adjusted under 35 U.S.C. 154(b) by 253 days.

(21) Appl. No.: 11/396,648

(22) Filed: Apr. 4, 2006

(65) Prior Publication Data

US 2006/0218907 A1 Oct. 5, 2006

(30) Foreign Application Priority Data

Apr. 5, 2005 (FR) .................................. 05 03390

(51) Int. Cl.
*B32B 9/00* (2006.01)
*C23C 16/00* (2006.01)

(52) U.S. Cl. ..................... 428/408; 418/178; 418/179; 204/192.15; 204/192.16; 427/249.1; 427/249.7; 427/249.8; 428/336; 428/446; 428/704

(58) Field of Classification Search ............... 418/178, 418/179; 428/336, 446, 704, 408; 427/249.1, 427/249.7, 249.8, 577; 204/192.15, 195.16
See application file for complete search history.

(56) References Cited

U.S. PATENT DOCUMENTS

| | | | | |
|---|---|---|---|---|
| 4,974,498 A * | 12/1990 | Lemelson | ................ | 123/193.6 |
| 5,249,554 A * | 10/1993 | Tamor et al. | ............. | 123/90.51 |
| 6,299,425 B1 * | 10/2001 | Hirano et al. | ................ | 428/408 |
| 6,652,969 B1 * | 11/2003 | Murakami et al. | .......... | 428/408 |
| 6,844,068 B1 * | 1/2005 | Miyake et al. | .............. | 428/336 |

FOREIGN PATENT DOCUMENTS

| | | |
|---|---|---|
| EP | 0874066 | 10/1998 |
| WO | WO 02/099261 | 12/2002 |

OTHER PUBLICATIONS

International Search Report.

* cited by examiner

*Primary Examiner*—Archene Turner
(74) *Attorney, Agent, or Firm*—Antonelli, Terry, Stout & Kraus, LLP.

(57) ABSTRACT

The present invention relates to a component scavenged by exhaust gases, notably a component of an internal-combustion engine (12) and/or of at least an exhaust gas circulation circuit (14, 16, 18, 20) belonging to an engine set (10).

According to the invention, the surfaces in contact with the exhaust gases of at least one component are provided with a protective coating comprising at least partly amorphous carbon of local structure close to diamond.

20 Claims, 1 Drawing Sheet

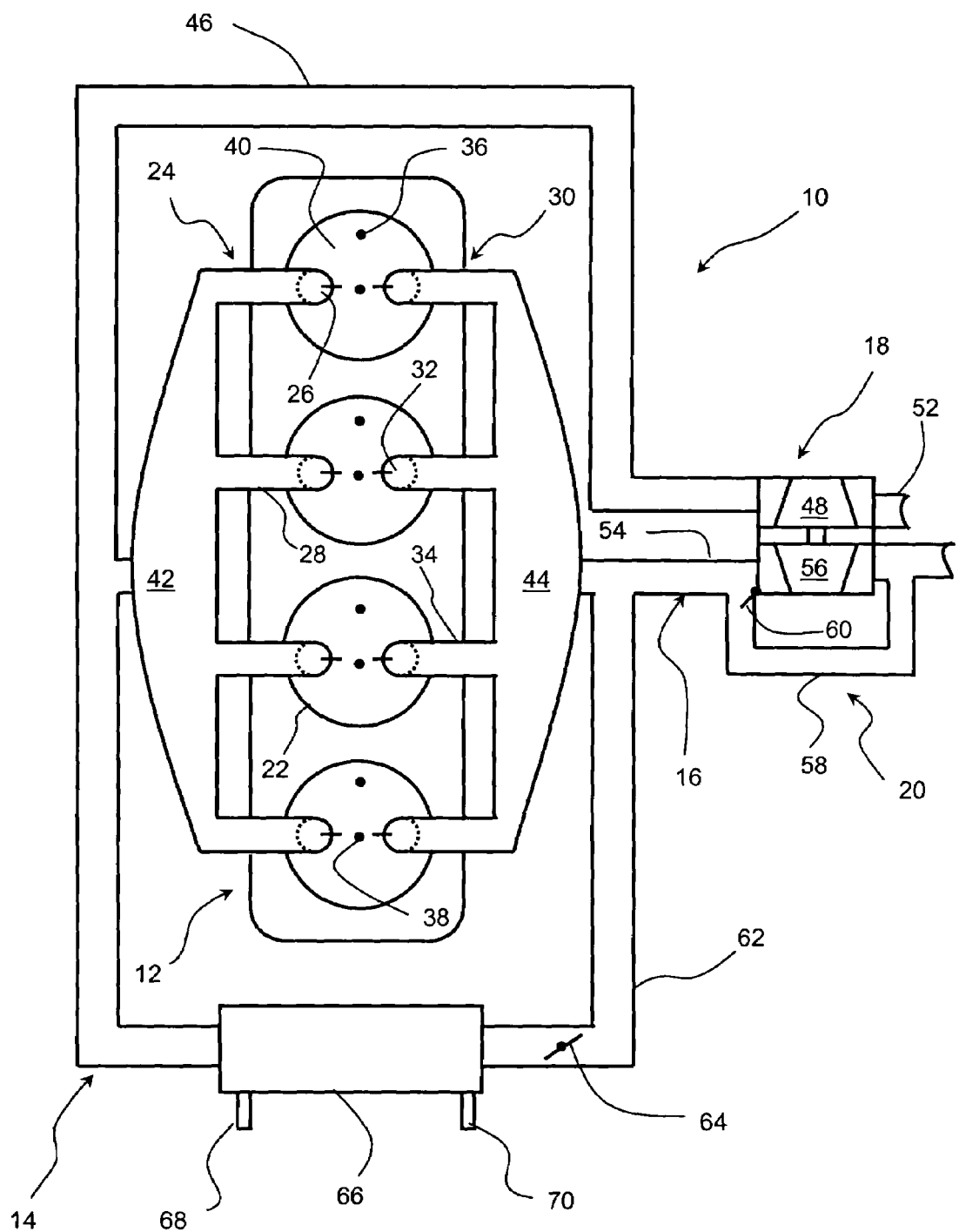

COMPONENT SCAVENGED BY EXHAUST GASES, NOTABLY ENGINE SET COMPONENT, AND METHOD FOR COATING SUCH A COMPONENT

FIELD OF THE INVENTION

The present invention relates to a component that is in contact with exhaust gases, notably a component of an engine set with an internal-combustion engine having at least one exhaust gas circulation circuit.

Such engines generally work with such a recirculation in order to improve the reduction of emissions, more particularly of nitrogen oxides (NOx).

BACKGROUND OF THE INVENTION

As it is well known, recirculation of part of the exhaust gas to the engine intake in order to reduce NOx emissions has become a common process. In fact, the exhaust gases are used for that purpose because they are oxygen-poor gases resulting from the combustion of the previous engine running cycles. Thus, introduction of such exhaust gases into the cylinders in the intake phase has the effect of decreasing the amount of fresh air that can mix with the fuel. This allows to lower the combustion temperature of the fuel mixture and consequently to reduce the production of NOx resulting from this combustion.

Generally, this exhaust gas recirculation is carried out by means of a circuit referred to as EGR (Exhaust Gas Recirculation) circuit, comprising a line connecting the exhaust manifold of the engine to the intake manifold thereof. This line is provided with a valve referred to as EGR valve, which allows to control the flow of gas circulating therein between a fully closed position and a fully open position of the valve.

A recirculated exhaust gas exchanger-cooler referred to as EGR cooler is advantageously provided, which has the effect of controlling the temperature of the exhaust gases before they are fed into the intake manifold. This cooler consists of tubes (or of gilled tubes) wherein a cooling fluid circulates and which are scavenged by the exhaust gases so as to exchange the calories of these gases with the cooling fluid.

The engine can also be a supercharged air type engine comprising a supercharging device such as a turbosupercharger, which compresses the ambient air it receives and sends it, in compressed state, to the engine intake. This turbosupercharger, usually arranged in the exhaust line, comprises a turbine that is driven in rotation by the exhaust gases from the engine that circulate in this exhaust line. The turbine is linked in rotation with a supercharger so that the rotation thereof compresses the ambient air before it is sent to the engine intake.

This supercharging device also comprises an exhaust gas discharge circuit allowing to control the amount of exhaust gas flowing through the turbine. A bypass line starting on the exhaust line upstream from the turbine and ending downstream from the turbine on this exhaust line is therefore provided. A discharge valve more commonly referred to as waste gate is arranged upstream from the turbine at the intersection of the bypass line and of the exhaust line. The waste gate can take a plurality of intermediate positions between a fully closed position where it closes the bypass line so that all of the exhaust gases flows through the turbine and a fully open position where it frees the inlet of the bypass line. This waste gate thus allows to control the amount of exhaust gases at the turbine inlet and, consequently, the pressure of the air leaving the supercharger.

These devices, although they give satisfactory results, however involve a certain number of drawbacks.

In fact, the large-size cold surfaces of a large part of the components of an engine such as those of the exchanger-cooler of the EGR circuit in particular are in contact with the hot exhaust gases containing unburned hydrocarbons, sulfur oxides, nitrogen oxides and soot particles. Soot particles can hang on to these surfaces whereas sulfur and nitrogen containing products can form corrosive acids as they condense on these surfaces, thus resulting in fouling and/or corrosion possibilities for the components in contact with the exhaust gases.

Thus, fouling of the outer surfaces of the tubes or gilled tubes of the exchanger-cooler can reduce its exchange capacity with the cooling fluid, thus causing degradation of the performances thereof. Furthermore, corrosion of the constituent parts of this exchanger-cooler by the acids reduces the life of the EGR circuit.

This fouling can also lead to a decrease in the functional capacities of some engine components such as EGR valves and waste gates, total sealing in the closed positions being then no longer provided, or such as injection nozzles some passages of which may be partly clogged by the soot particles.

Furthermore, the lines of the EGR circuit, of the discharge circuit and the exhaust line can undergo fouling due to the particles and/or corrosion due to the sulfur and nitrogen containing products.

The present invention aims to overcome the aforementioned drawbacks by means of components that are not subject to fouling through the exhaust gases.

SUMMARY OF THE INVENTION

The invention therefore relates to a component scavenged by exhaust gases, notably a component of an internal-combustion engine and/or of at least an exhaust gas circulation circuit belonging to an engine set, characterized in that the surfaces in contact with the exhaust gases of at least one component are provided with a protective coating comprising at least partly amorphous carbon of local structure close to diamond.

The coating thickness can typically range from some microns to about 0.5 mm.

Advantageously, the coating can comprise a hydrogen fraction.

Preferably, the hydrogen can be mixed with at least one heteroelement.

The heteroelement can be selected from silicon, fluorine, oxygen, nitrogen.

The coating can comprise a hydrogen fraction of at most 80%.

The coating can comprise a heteroelement fraction of at most 20%.

The invention also relates to a method for coating surfaces in contact with exhaust gases of at least part of the components according to which the protective coating comprising at least partly amorphous carbon of local structure close to diamond can be deposited by plasma decomposition of light hydrocarbon gases.

The protective coating comprising at least partly amorphous carbon of local structure close to diamond can also be deposited by ablation of a carbon target.

BRIEF DESCRIPTION OF THE FIGURE

Other features and advantages of the invention will be clear from reading the description hereafter, given by way of non limitative example, with reference to the sole figure showing an engine set according to the invention.

DETAILED DESCRIPTION

In this figure, engine set 10 comprises an internal-combustion engine 12 associated with at least one exhaust gas circulation circuit with an exhaust gas recirculation circuit 14 or EGR circuit, an exhaust line 16 on which a turbosupercharger 18 with its discharge circuit 20 is arranged.

Engine 12 comprises at least one cylinder 22 with at least one intake means 24 with an intake valve 26 and an intake pipe 28, and at least one exhaust means 30 with an exhaust valve 32 and an exhaust pipe 34. If the internal-combustion engine is a spark-ignition direct-injection engine, each cylinder is provided with a fuel injection nozzle 36 in the cylinder and a spark plug 38 for ignition of the fuel/air mixture present in this cylinder. The cylinder comprises a piston (no reference number) that slides in a rectilinear reciprocating manner in this cylinder by delimiting a combustion chamber 40 between the top of the piston and generally the cylinder head (not shown) comprising the intake and exhaust means. Pipes 28 of the intake means are connected to an intake manifold 42 whereas the pipes of exhaust means 30 end into an exhaust manifold 44.

Intake manifold 42 is connected by a line 46 to the outlet of a compression stage 48 of turbosupercharger 18 receiving outside air through a line 52. Exhaust manifold 44 is connected to exhaust line 16 which generally comprises an exhaust pipe 54 for discharging the engine exhaust gases to the atmosphere. The inlet of driving stage 56 of turbosupercharger 18 is located on this pipe. This stage comprises, as it is well known, a turbine that is driven in rotation by the exhaust gases which thereafter end in exhaust pipe 54 after flowing through the turbine.

Discharge circuit 20 of this turbosupercharger comprises a bypass line 58 which starts upstream from driving stage 56 on exhaust pipe 54, bypasses this stage and eventually opens onto the exhaust pipe downstream from this driving stage. A waste gate 60 controlling the flow of exhaust gas passing through stage 56 is arranged at the intersection between bypass line 58 and pipe 54.

Recirculation circuit 14 comprises an exhaust gas recirculation pipe 62 that starts at exhaust pipe 54 and opens onto the inlet of intake manifold 42. This recirculation pipe is provided with a valve 64 referred to as EGR valve allowing to control the amount of exhaust gas reintroduced in manifold 42. Furthermore, this pipe is also provided with an exchanger-cooler 66 through which the exhaust gases flow, which is thus used to control the temperature of these gases at the inlet of the intake manifold. A cooling fluid, generally the engine coolant, flows through this exchanger between an inlet 68 and an outlet 70.

Thus, exhaust gases flow through a majority of the constituent components of engine set 10, either upon recirculation of these gases or for driving the turbosupercharger or for discharging the gases.

More precisely, in the example described, the recirculated exhaust gases scavenge combustion chambers 40, the intake 24 and exhaust means with their valves and pipes, intake 42 and exhaust 44 manifolds, exhaust pipe 54, turbosupercharger driving stage 56 with its turbine, discharge circuit 20 with its bypass line and its waste gate, and EGR circuit 14 with the recirculation pipe, the exchanger-cooler and the EGR valve.

In order to prevent these components from being subject to fouling and/or corrosion through the exhaust gases, the surfaces scavenged by the exhaust gases of all or part of these components are provided with a protection, advantageously in form of a film, comprising an amorphous carbon material of local structure close to diamond, more commonly known as DLC (Diamond-Like Carbon).

In this type of material, a fraction of the carbon atoms has atomic bonds with a tetrahedral arrangement (bonds referred to as of $sp^3$ nature) characteristic of the local structure of diamond. The fraction of $sp^3$ bonds, generally in the 0.3-0.9 range, is typically above 0.5. These amorphous carbon forms close to diamond have a hardness above 10 GPa, up to 130 GPa, and a low friction coefficient (below 0.12 for a fraction of $sp^3$ bonds above 0.75).

DLC has advantageous properties, notably for use in heat exchange systems and, in particular, for exchanger-cooler 66 of the EGR circuit. Its thermal conductivity is high (700 W $m^{-1}$ $K^{-1}$, comparable to copper: 400 and above aluminium: 235). It also exhibits good resistance to chemical corrosion.

The use of DLC also significantly reduces fouling of the surfaces it protects by greatly limiting the deposition of soot particles and of unburned hydrocarbon molecules.

The DLC is preferably deposited by means of plasma decomposition of light hydrocarbon gases such as acetylene, ethylene, methane and others. Advantageously, the hydrocarbon gas can be mixed with hydrogen or with a rare gas such as argon.

Deposition can also be performed by ablation of a carbon target, as described in "Journal of Materials Science" of 15 May 2004 according to the publication "Synthesis of HDLC films from solid carbon" by R. L. Mills, J. Sankar, P. Ray, A. Voigt, J. He and B. Dhandapani.

Advantageously, the deposition thickness typically ranges from some microns (2 to 4 microns) to about 0.5 mm.

The DLC coating can also include a fraction of hydrogen and of other elements such as, for example, F, Si, O, N. These elements are introduced by addition of reactive gases (for example $C_2F_2$, $Si(CH_3)_4$, $O_2$ or $N_2$ respectively) to the hydrocarbon used for forming the deposit.

The method is thus well suited for depositions on complex metallic surfaces.

Inclusion of heteroelements allows the properties to be modulated according to the planned operating conditions. In fact, an anti-fouling deposition approach consists in making the material surface repellent or less attractive to the compounds responsible for fouling. For example, depositions without hydrogen have less interactions with the oxygen compounds and will therefore favour fouling reduction through these compounds. On the other hand, depositions with hydrogen have less interactions with hydrocarbons.

Advantageously, the hydrogen proportion can range from 0% to 80%, the silicon, fluorine, oxygen or nitrogen proportion can range from 0% to 20%.

The present invention is not limited to the example described and involves any variant or equivalent.

Notably, we have mentioned so far components of an engine set scavenged by exhaust gases from an internal-combustion engine. This component can also be part of any other unit such as a gas turbine whose exhaust gases (or fumes) scavenge the expander and possibly a heat exchanger in case of a cogeneration turbine.

The invention claimed is:

1. A component, scavenged by exhaust gases, an exhaust gas recirculation circuit belonging to an engine set, characterized in that the surfaces in contact with the exhaust gases of the component are provided with a protective coating comprising at least partly amorphous carbon of local structure close to diamond.

2. The component scavenged by exhaust gases as claimed in claim 1, characterized in that the protective coating thickness ranges from a plurality of microns to about 0.5 mm.

3. The component scavenged by exhaust gases as claimed in claim 1, characterized in that the protective coating comprises a hydrogen fraction.

4. The component scavenged by exhaust gases as claimed in claim 3, characterized in that the hydrogen is mixed with at least one heteroelement.

5. The component scavenged by exhaust gases as claimed in claim 4, characterized in that the heteroelement is selected from among silicon, fluorine, oxygen, nitrogen.

6. A method for coating surfaces in contact with exhaust gases of at least part of the components as claimed in claim 1, characterized in that the protective coating comprising at least partly amorphous carbon of local structure close to diamond is deposited by plasma decomposition of light hydrocarbon gases.

7. A method for coating surfaces in contact with exhaust gases of at least part of the components as claimed in claim 1, characterized in that the protective coating comprising at least partly amorphous carbon of local structure close to diamond is deposited by ablation of a carbon target.

8. An engine set comprising an internal-combustion engine and at least one exhaust gas recirculation circuit allowing recirculation of the exhaust gases in the engine, characterized in that it comprises at least one component scavenged by exhaust gases as claimed in claim 1.

9. An engine set comprising an internal-combustion engine and at least one exhaust gas recirculation circuit for controlling an intake air supercharging device, characterized in that it comprises at least one component scavenged by exhaust gases as claimed in claim 1.

10. An engine set comprising an internal-combustion engine, at least one exhaust gas recirculation circuit and at least one exhaust line for discharge of the exhaust gases, characterized in that it comprises at least one component scavenged by exhaust gases as claimed in claim 1.

11. The component scavenged by exhaust gases as claimed in claim 1, characterized in that a fraction of the carbon atoms in the protective coating has atomic sp3 bonds with a tetrahedral arrangement characteristic of a local structure of diamond, the fraction of sp3 bonds being above 0.5, and the protective coating has a hardness above 10 GPa and up to 130 GPa, and a low friction coefficient below 0.12 for a fraction of sp3 bonds above 0.75.

12. An engine set comprising an internal-combustion engine and at least one exhaust gas recirculation circuit allowing recirculation of the exhaust gases in the engine, wherein surfaces of at least one component of the at least one exhaust gas recirculation circuit in contact with the exhaust gases are provided with a protective coating comprising at least partly amorphous carbon of local structure close to diamond.

13. The engine set as claimed in claim 12, wherein a fraction of the carbon atoms in the protective coating has atomic sp3 bonds with a tetrahedral arrangement characteristic of a local structure of diamond, the fraction of sp3 bonds being above 0.5, and the protective coating has a hardness above 10 GPa and up to 130 GPa, and a low friction coefficient below 0.12 for a fraction of sp3 bonds above 0.75.

14. The engine set as claimed in claim 12, wherein the at least one component is an exchanger-cooler of the exhaust gas recirculation circuit.

15. The engine set as claimed in claim 12, wherein the at least one component comprises an exhaust gas recirculation pipe that starts at an exhaust pipe of the internal-combustion engine and opens onto the inlet of an intake manifold of the internal-combustion engine, an exchanger-cooler and an exhaust gas recirculation valve for controlling an amount of exhaust gas reintroduced in a manifold of the exchanger-cooler.

16. The engine set as claimed in claim 12, wherein combustion chambers of the internal-combustion engine, intake and exhaust valves and pipes of the internal-combustion engine, intake and exhaust manifolds of the internal-combustion engine, an exhaust pipe of the internal-combustion engine, and a turbosupercharger driving stage comprising a turbine, a discharge circuit including a bypass line and a waste gate of the bypass line are also are provided with the protective coating comprising at least partly amorphous carbon of local structure close to diamond.

17. The engine set as claimed in claim 12, wherein the protective coating thickness ranges from a plurality of microns to about 0.5 mm.

18. The engine set as claimed in claim 12, wherein the protective coating comprises a hydrogen fraction.

19. The engine set as claimed in claim 18, wherein the hydrogen is mixed with at least one heteroelement.

20. The engine set as claimed in claim 19, characterized in that the heteroelement is selected from among silicon, fluorine, oxygen, nitrogen.

* * * * *